United States Patent [19]

Sato

[11] Patent Number: 5,586,892
[45] Date of Patent: Dec. 24, 1996

[54] ELECTRICALLY CONNECTING STRUCTURE

[75] Inventor: Minoru Sato, Hamura, Japan

[73] Assignee: Casio Computer Co., Ltd., Tokyo, Japan

[21] Appl. No.: 397,919

[22] Filed: Mar. 3, 1995

[30]  Foreign Application Priority Data

Mar. 10, 1994 [JP] Japan .................................. 6-065417

[51] Int. Cl.⁶ ...................................................... H01R 4/04
[52] U.S. Cl. ........................................... 439/91; 174/88 R
[58] Field of Search .......................... 439/66, 91; 359/88; 174/84 R, 88 R, 94 R, 259

[56]   References Cited

U.S. PATENT DOCUMENTS

| 4,113,981 | 9/1978 | Fujita et al. | 174/88 R |
| 5,001,302 | 3/1991 | Atsumi | 439/91 |
| 5,180,888 | 1/1993 | Sugiyama et al. | 174/88 R |

*Primary Examiner*—Neil Abrams
*Attorney, Agent, or Firm*—Frishauf, Holtz, Goodman, Langer & Chick

[57]   ABSTRACT

An electrically connecting structure including a first electronic part having a first connecting terminal, a second electronic part having a second connecting terminal which is arranged to face the first connecting terminal of the first electronic part, and an anisotropic conductive adhesive arranged between the first connecting terminal and the second connecting terminal. The anisotropic conductive adhesive includes an insulating adhesive, a plurality of first conductive particles which are covered with an insulating layer, and a plurality of second conductive particles which are not covered with any material. The first conductive particles and the second conductive particles have substantially the same size. Portions of the insulating layer covering the first conductive particles are brought into contact with the first connecting terminal and the second connecting terminal, and are broken away, under a force which is applied to the first connecting terminal and the second connecting terminal, so that the first conductive particles are brought into contact with the first connecting terminal and the second connecting terminal. The second conductive particles are brought into contact with the first connecting terminal and the second connecting terminal under the force which is applied to the first connecting terminal and the second connecting terminal, and the first connecting terminal and the second connecting terminal are electrically connected to each other through the first conductive particles and the second conductive particles.

20 Claims, 3 Drawing Sheets

ELECTRICALLY CONNECTING STRUCTURE

BACKGROUND OF THE INVENTION

1. Field of the Invention

The present invention relates to an electrically connecting structure for connecting one terminal to another terminal with an anisotropic conductive adhesive, which terminals are arranged to face each other.

2. Description of the Prior Art (Related Art)

Generally, a liquid crystal display device comprises a liquid crystal display panel, semiconductor chips (electronic parts) for driving the liquid crystal display panel, and a circuit board for controlling the semiconductor chips.

FIG. 4 is a view showing an example of the conventional liquid crystal display device described above. This liquid crystal display device comprises a liquid crystal display panel 1, two semiconductor chips 2 and 2a, a flexible wiring board 3, and a circuit board (not shown) which controls the semiconductor chips 2 and 2a. The liquid crystal display panel includes an upper transparent board 4 and a lower transparent board 5, which are rectangular and arranged to face each other, and a liquid crystal material (not shown) which is interposed between the upper transparent board 4 and the lower transparent board 5. The size of the lower transparent board 5 is larger than that of the upper transparent board 4. When the upper transparent board 4 is mounted on the lower transparent board 5 in an overlapping manner with the two adjacent sides thereof meeting with the corresponding adjacent sides of the lower transparent board 5, then a portion of the lower transparent board 5 that is not covered with the upper transparent board 4 can be seen when viewed from the top, as shown in FIG. 4. On the portion (an extended portion) of the lower transparent board 5 that is not covered by the upper transparent board 4, output connecting terminals (output wirings) 6, input connecting terminals (input wirings) 7, and power connecting terminals (power wirings) 8 for a power source are formed. One semiconductor chip 2 is mounted on the extended portion of the lower transparent board 5. In this case, as shown in FIG. 5, input connecting bumps 11, power connecting bumps 12 for a power source, and output connecting bumps (not shown) are formed on a lower surface of the semiconductor chip 2. The input connecting bumps 11 formed on the lower surface of the semiconductor chip 2 are respectively electrically connected to the input connecting terminals 7 formed on the lower transparent board 5. One group of the power connecting bumps 12 formed on the lower surface of the semiconductor chip 2 are electrically connected to one of the power connecting terminals 8 formed on the lower transparent board 5, and another group of the power connecting bumps 12 (12a) are electrically connected to another of the power connecting terminals 8 (8a). The output connecting bumps formed on the lower surface of the semiconductor chip 2 are respectively electrically connected to the output connecting terminals 6 formed on the lower transparent board 5.

Another semiconductor chip 2a is also mounted on the extended portion of the lower transparent board 5 in the same way. A flexible wiring board 3 is linked at one side thereof to the extended portion of the lower transparent board 5, so that wirings (not shown) which are formed on the flexible wiring board 3 are electrically connected to the input connecting terminals 7 and the power connecting terminals 8 of the lower transparent board 5, and another side of the flexible wiring board 3 is linked to the circuit board which controls the semiconductor chips 2 and 2a.

FIG. 6 is a cross sectional view showing an example of an electrically connecting structure for connecting the connecting terminals 7 and 8 of the lower transparent board 5 to the connecting bumps 11 and 12 of the semiconductor chip 2. In FIG. 6, the input connecting terminals 7 of the lower transparent board 5 are electrically connected to the input connecting bumps 11 of the semiconductor chip 2 through an anisotropic conductive adhesive 13. The anisotropic conductive adhesive 13 is made of an insulating adhesive 16 which contains a large number of conductive particles 15, and is formed into a tape-shaped member. The conductive particles 15 are covered with an insulating layer 14 and mixed with the insulating adhesive 16 at an appropriate ratio. At first, the anisotropic conductive adhesive 13 is arranged between a portion of the lower transparent board 5, on which the input connecting terminals 7 are formed, and a portion of the semiconductor chip 2, on which the input connecting bumps 11 are formed, so that a lower surface of the insulating adhesive 16 faces the input connecting terminals 7 and the lower transparent board 5, and an upper surface of the insulating adhesive 16 faces the input connecting bumps 11 and the semiconductor chip 2.

Then the portion of the lower transparent board 5, on which the input connecting terminals 7 are formed, and the portion of the semiconductor chip 2, on which the input connecting bumps 11 are formed, are bonded together with the anisotropic conductive adhesive 13 under heat and pressure. During the bonding process, portions of the insulating adhesive 16, which are put between the input connecting terminals 7 and the conductive particles 15 and between the input connecting bumps 11 and the conductive particles 15 escape therefrom under pressure applied to the lower transparent board 5 and the semiconductor chip 2 to bond them together in the beginning. Thereafter, portions of the insulating layers 14 on the conductive particles 15, which portions come into contact with the input connecting terminals 7 and the input connecting bumps 11, are consequently broken. Hence the conductive particles 15 are brought into contact with the input connecting terminals 7 and the input connecting bumps 11. At this time, other portions of the insulating layers 14 are not broken and still remain on the conductive particles 15. Hence the conductive particles 15 are brought into contact with the input connecting terminals 7 and the input connecting bumps 11. As a result, the input connecting terminals 7 and the input connecting bumps 11 are electrically connected to one another through the conductive particles 15 of the anisotropic conductive adhesive 13. Thereafter, the insulating adhesive 16 and the insulating layer 14 are hardened so that the portion of the lower transparent board 5, on which the input connecting terminals 7 are formed, adheres firmly to the portion of the semiconductor chip 2, on which the input connecting terminal 11 are formed. In this case, if the conductive particles 15 are linked to each other, insulation between the conductive particles 15 is sufficiently kept by insulating layers 14 which are still left on the conductive particles 15.

However, in such a conventional anisotropic conductive adhesive 16, when the anisotropic conductive adhesive 16 is heated and pressured so that the portions of the insulating layers 14, which portions come into contact with the input connecting terminals 7 and the input connecting bumps 11, are broken, thin films of the insulating layers 14 are still left on the portions of the surfaces of the conductive particles 15, which portions face to the input connecting terminals 7 and the input connecting bumps 11, according to circumstances.

Therefore, when a pitch of the connecting bumps 11 and 12 of the semiconductor chip 2 is about 60 μm, it is difficult to achieve an electric current flow of about 10 mA from the input connecting terminal 7 of the lower transparent board 5 into the input connecting bump 11 of the semiconductor chip 2 through the conductive particles 15 of the anisotropic conductive adhesive 13. Further, it is needed to achieve an electric current flow of about 200–300 mA from the power connecting terminal 8a of the lower transparent board 5 into the power connecting bumps 12a of the semiconductor chip 2 under some conditions for driving the liquid crystal display panel 1. In such a case of connecting the power connecting terminal 8a to the power connecting bumps 12a, it is needed to provide at least 20–30 power connecting bumps 12a on the semiconductor chip 2. Hence the semiconductor chip 2 is getting larger and high-priced.

SUMMARY OF THE INVENTION

The present invention has been made to overcome the above drawbacks, and has an object to provide an electrically connecting structure for connecting one terminal to another terminal arranged face to the one terminal with an anisotropic conductive adhesive, which structure will decrease an electric resistance between the one terminal and the another terminal.

According to the present invention, there is provided an electrically connecting structure comprising:

a first electronic part having a first connecting terminal;

a second electronic part having a second connecting terminal which is arranged to face said first connecting terminal of said first electronic part; and an anisotropic conductive adhesive arranged between said first connecting terminal and said second connecting terminal, said anisotropic conductive adhesive including an insulating adhesive, plurality of first conductive particles which are covered with an insulating layer, and plurality of second conductive particles which are not covered with any material, portions of said insulating layer covering said first conductive particles being brought into contact with said first connecting terminal and said second connecting terminal, and broken away, under force which is applied to said first connecting terminal and said second connecting terminal, so that said first conductive particles are brought into contact with said first connecting terminal and said second connecting terminal, and said second conductive particles being brought into contact with said first connecting terminal and said second connecting terminal under the force applied thereto, wherein said first connecting terminal and said second connecting terminal are electrically connected to each other through said first conductive particles and said second conductive particles.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

Other objects and structures of the present invention will be more fully understood from the description, when taken in conjunction with the accompanying drawings in which.

DETAILED DESCRIPTION OF THE PREFERRED EMBODIMENTS

Now, preferred embodiments of an electrically connecting structure of the present invention will be described in detail with reference to the accompanying drawings.

Figure 1:
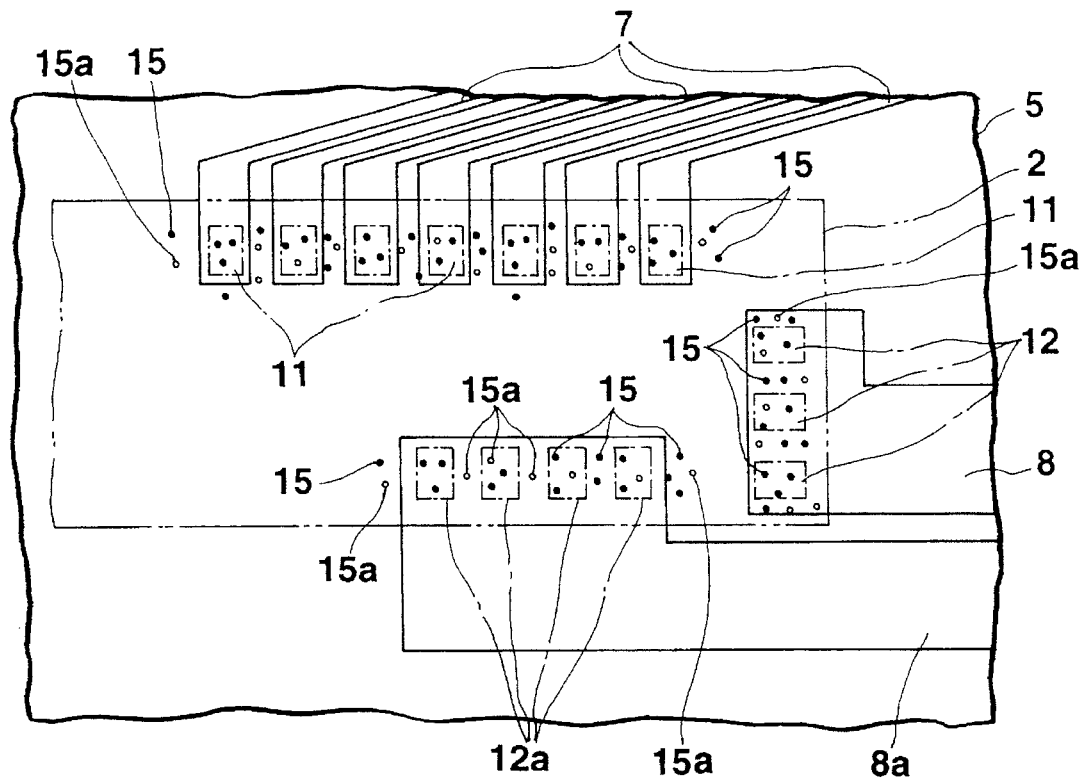
FIG. 1 is an enlarged plan view showing a main portion of an electrically connecting structure of the present invention, in which a liquid crystal display panel and a semiconductor chip are connected to each other by using an anisotropic conductive adhesive.
Figure 2:
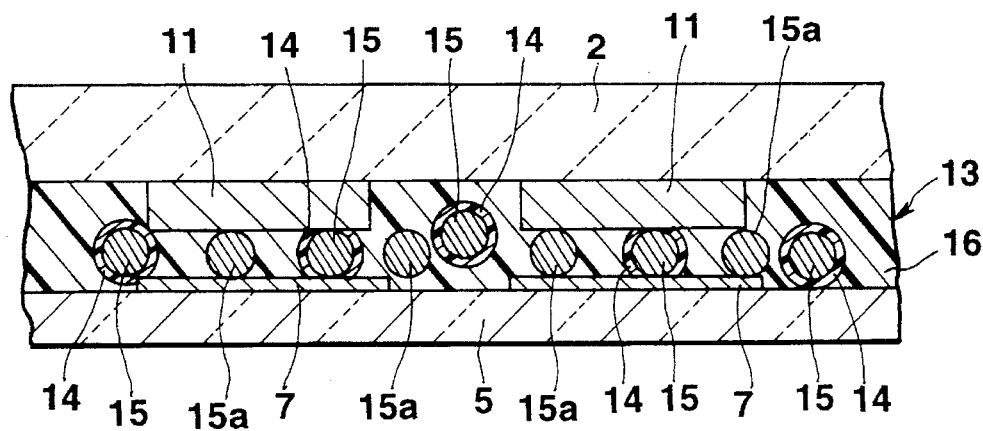
FIG. 2 is a cross sectional view showing a portion of the electrically connecting structure of FIG. 1.

FIG. 1 is an enlarged plan view showing a main portion of an electrically connecting structure of the present invention, in which a liquid crystal display panel and a semiconductor chip (an electronic part) are connected to each other by using an anisotropic conductive adhesive. FIG. 2 is a cross sectional view showing a portion of the electrically connecting structure of FIG. 1.

An anisotropic conductive adhesive 13 is made of an insulating adhesive 16 containing a large number of covered conductive particles 15 which are covered with an insulating layer 14, and a large number of non-covered conductive particles 15a which are not covered with any material. The anisotropic conductive adhesive 13 is formed into a tape-shaped member. The covered conductive particles 15 and the non-covered conductive particles 15a are mixed with the insulating adhesive 16 at appropriate ratios. In this case, the covered conductive particle 15 and the non-covered conductive particle 15a are made of metal, such as gold, silver, copper, iron, nickel, and aluminum, and have a diameter of about 5 μm. The insulating layer 14 is made of resin such as thermoplastic resin. The insulating adhesive 16 is made of resin such as thermoplastic resin or thermosetting resin.

In FIG. 1, the covered conductive particles 15 are represented by dots and the non-covered conductive particles 15a are represented by circles. Input connecting terminals 7 and power connecting terminals 8 and 8a, which are formed on an upper surface of the lower transparent board 5, are respectively electrically connected to input connecting bumps 11 and power bumps 12 and 12a, which are formed on the lower surface of the semiconductor chip 2, with the anisotropic conductive adhesive 13. The process of the electrically connecting structure mentioned above is described below.

At first, the anisotropic conductive adhesive 13 is arranged throughout on a lower surface of the semiconductor chip 2. Thereafter, the semiconductor chip 2 is put on the lower transparent board 5, so that the connecting terminals 7, 8, and 8a, and the connecting bumps 11, 12, and 12a are arranged to face each other through the anisotropic conductive adhesive 13. Hence the anisotropic conductive adhesive 13 is arranged between a portion of the lower transparent board 5, on which the connecting terminals 7, 8, and 8a are formed, and a portion of the semiconductor chip 2, on which the connecting bumps 11, 12, and 12a are formed, so that a lower surface of the insulating adhesive 16 faces the connecting terminals 7, 8, and 8a, and the lower transparent board 5, and an upper surface of the insulating adhesive 16 faces the connecting bumps 11, 12, and 12a, and the semiconductor chip 2. Then the portion of the lower transparent board 5, on which the connecting terminals 7, 8, and 8a are formed, and the portion of the semiconductor chip 2, on which the connecting bumps 11, 12, and 12a are formed, are bonded together with the anisotropic conductive adhesive 16 under heat and pressure. During the bonding process thereof under heat and pressure, portions of the insulating adhesive 16, which are put between the connecting terminals 7, 8, and 8a, and the conductive particles 15 and 15a, and between the connecting bumps 11, 12, and 12a, and the conductive particles 15 and 15a escape therefrom under pressure applied to the lower transparent board 5 and the semiconductor chip 2 to bond them together in the beginning. Thereafter, portions of the insulating layers 14 which wrap the covered conductive particles 15, which portions come into contact with the connecting terminals 7, 8, and 8a, and the connecting bumps 11, 12, and 12a, are consequently broken in the same way as the conventional art. Hence the covered conductive particles 15 are brought into contact with the connecting terminals 7, 8, and 8a, and the connecting bumps 11, 12, and 12a. Further, portions of surfaces of the non-covered conductive particles 15a, which portions face the connecting terminal 7, 8, and 8a, and the connecting bump 11, 12, and 12a, are brought into contact with the connecting terminal 7, 8, and 8a, and the connecting bumps 11, 12, and 12a. At this time, other portions of the insulating layers 14 are not broken and still remain on the covered conductive particles 15.

As a result, the connecting terminals 7, 8, and 8a are respectively electrically connected to the connecting bumps 11, 12, and 12a through the covered conductive particles 15 and the non-covered conductive particles 15a which are included in the anisotropic conductive adhesive 13. In this case, the non-covered conductive particles 15a come into contact with the connecting terminals 7, 8, 8a, and the connecting bumps 11, 12, and 12a directly, since the non-conductive particles 15a are not wrapped with the insulating layer 14. Hence an electric current which flows through the non-covered conductive particle 15a is ten times as much as that which flows through the covered conductive particle 15. In consequence, an electric resistance between the connecting terminals 7, 8, and 8a and the connecting bumps 11, 12, and 12a which are connected through the covered conductive particles 15 and the non-covered conductive particles 15a is lower than that between the connecting terminals and the connecting bumps of the conventional structure which are connected through only the covered conductive particles 15. When it is needed to allow an electric current of about 200–300 mA to flow from the power connecting terminal 8a into the power connecting bumps 12a on some conditions of driving the liquid crystal display panel 1, it is possible to decrease the number of the power bumps 12a. It is possible to make the semiconductor chip 2 smaller in size as small number of the power bumps 12a may be used. The insulation between the conductive particles 15 and 15a is sufficiently kept by the insulating layers 14 which are still left on the conductive particles 15.

Figure 3:
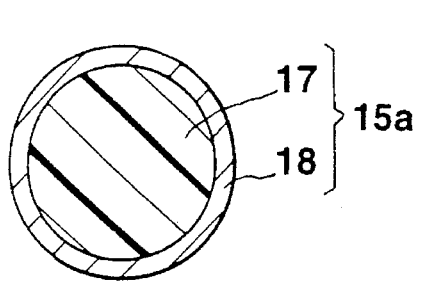
FIG. 3 is an enlarged cross sectional view showing an example of a non-covered conductive particle used in an embodiment of the electrically connecting structure of the present invention.
Figure 3A:
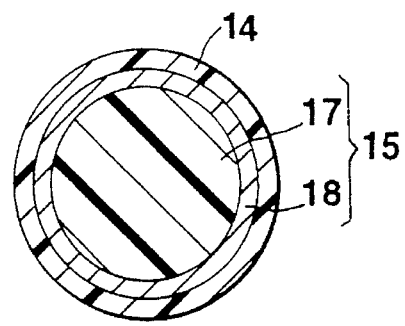
FIG. 3A is an enlarged cross sectional view showing an example of a covered conductive particle used in the embodiment of the electrically connecting structure of the present invention.
Figure 4:
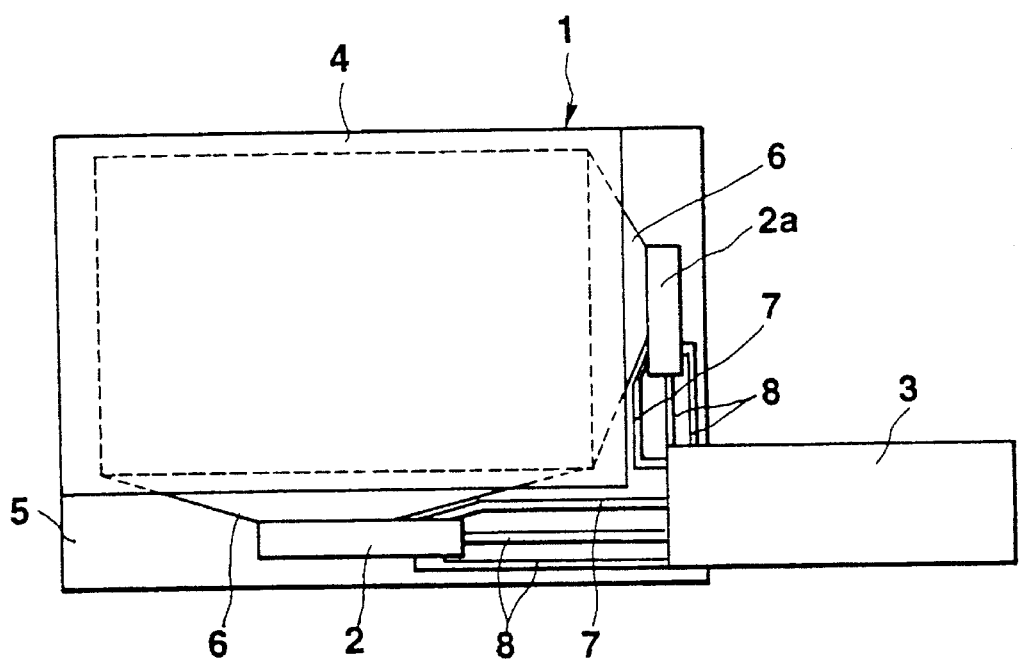
FIG. 4 is a plan view showing a liquid crystal display device in which the electrically connecting structure of the present invention is used.
Figure 5:
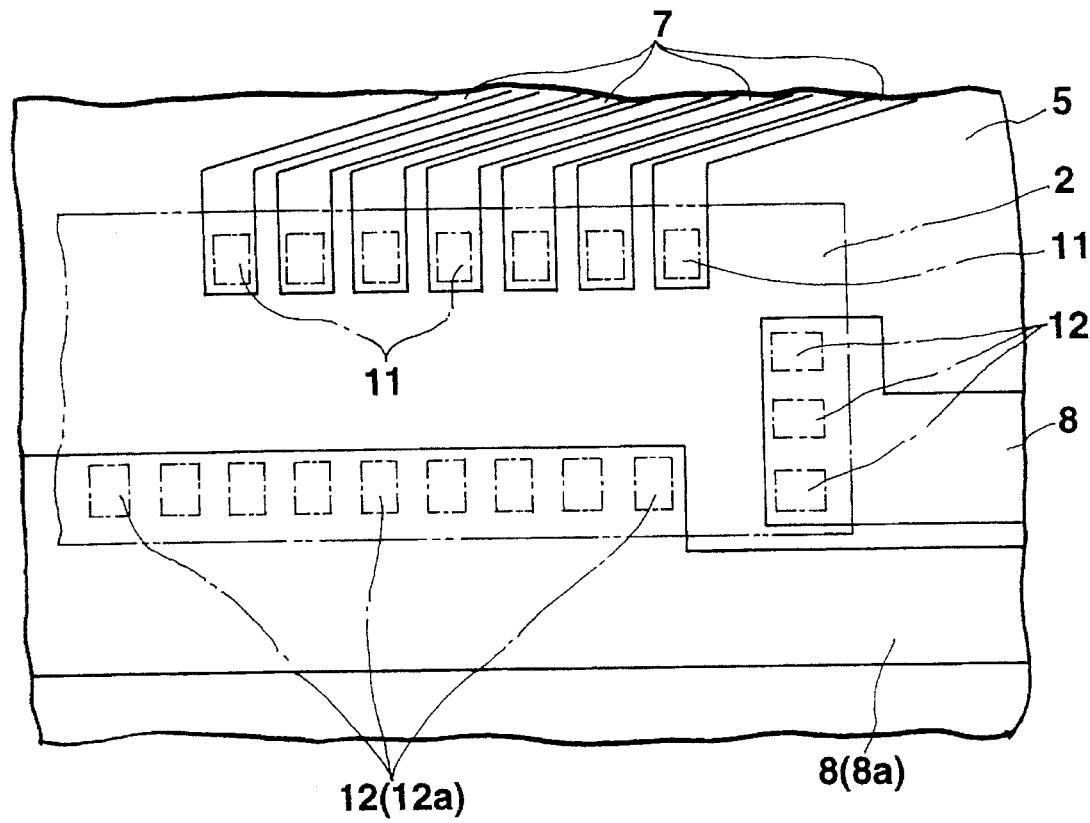
FIG. 5 is an enlarged plan view showing a main portion of the conventional electrically connecting structure in FIG. 4.
Figure 6:
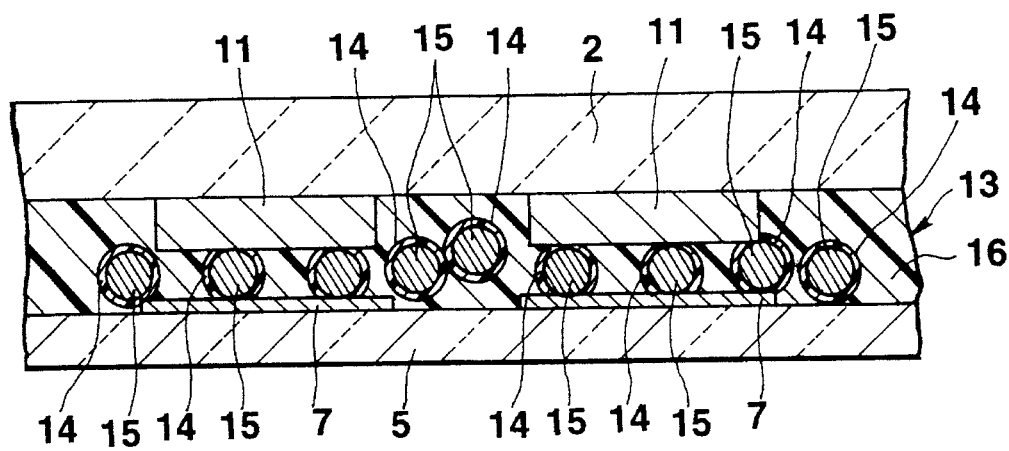
FIG. 6 is a cross sectional view showing a portion of the electrically connecting structure of FIG. 5.

FIG. 3 is an enlarged cross sectional view showing an example of a non-covered conductive particles 15a used in an embodiment of the electrically connecting structure of the present invention. In FIG. 3A is an enlarged cross sectional view showing an example of a covered conductive particle 15 used in the embodiment of the electrically connecting structure of the present invention. In FIG. 3, the non-covered conductive particle 15a comprises an insulating resin particle 17 and a conductive layer 18 which is made of metal, such as gold, silver, copper, iron, nickel, and aluminum, and covers the insulating resin particle 17. In FIG. 3A, the covered conductive particle 15 that is covered with the insulating layer 14 comprises the insulating resin particle 17 and the conductive layer 18 which are the same as described above. A plurality of the non-covered conductive particles 15a and a plurality of the covered conductive particles 15, as well as the insulating adhesive 16, are arranged between the connecting terminals 7, 8 and 8a, and the connecting bumps 11, 12 and 12a. Then the connecting terminals 7, 8 and 8a, and the connecting bumps 11, 12 and 12a are bonded together with the insulating adhesive 16 under heat and pressure. Hence the non-covered conductive particles 15a and the covered conductive particles 15 are brought into contact with the connecting terminals 7, 8, 8a and the connecting bumps 11, 12, 12a. In this case, since the non-covered conductive particles 15a and the covered conductive particles 15 are deformed by pressure during the bonding process, an area of the surface of each non-covered conductive particle 15a and each covered conductive particle 15 which contacts the connecting terminals 7, 8, and 8a and the connecting bumps 11, 12, and 12a is larger so that the electric resistance between the connecting terminals 7, 8, and 8a and the connecting bumps 11, 12, and 12a is lower.

It is desirable that the number of the covered conductive particles 15 to be mixed with the insulating adhesive 16 is substantially the same as that of the non-covered particles 15a. However, the number of the covered conductive particles 15 may be more than that of the non-covered conductive particles 15a.

In the above embodiment, metallic particles or the resin particles 17 covered with the conductive layer 18 are included in the conductive particles 15 and 15a. However, the metallic particles may be included in the covered conductive particles 15 and the resin particles 17 covered with the conductive layer 18 may be included in the non-covered conductive particles 15a, and vice versa. The electronic part 2 need not be a semiconductor chip 2. Instead, it may be another electronic part which includes connecting bumps which are similar to the connecting bumps 11, 12, and 12a.

Several embodiments of the present invention have been described in detail but these embodiments are simply illustrative and not restrictive. The present invention may be modified in various manners. All the modifications and applications of the invention will be within the scope and spirit of the invention, so that the scope of the present invention should be determined only by what is recited in the present appended claims and their equivalents.

What is claimed is:

1. An electrically connecting structure, comprising:

a first electronic part having a first connecting terminal;

a second electronic part having a second connecting terminal which is arranged to face said first connecting terminal of said first electronic part; and an anisotropic conductive adhesive arranged between said first connecting terminal and said second connecting terminal, said anisotropic conductive adhesive including:

an insulating adhesive, a plurality of first conductive particles which are covered with an insulating layer, and a plurality of second conductive particles which are not covered with any material, said first conductive particles and said second conductive particles having substantially the same size, portions of said insulating layer covering said first conductive particles being brought into contact with said first connecting terminal and said second connecting terminal, and being broken away, under a force which is applied to said first connecting terminal and said second connecting terminal, so that said first conductive particles are brought into contact with said first connecting terminal and said second connecting terminal, said second conductive particles being brought into contact with said first connecting terminal and said second connecting terminal under the force which is applied to said first connecting terminal and said second connecting terminal, and said first connecting terminal and said second connecting terminal being electrically connected to each other through said first conductive particles and said second conductive particles.

2. An electrically connecting structure according to claim 1, wherein other portions of said insulating layer covering said first conductive particles, which portions are not broken away under the force applied to said first connecting terminal and said second connecting terminal, still remain on said first conductive particles.

3. An electrically connecting structure according to claim 2, wherein at least one of said first conductive particles and said second conductive particles is made of metal and said insulating layer covering said first conductive particles is made of thermoplastic resin.

4. An electrically connecting structure according to claim 3, wherein said first electronic part is a semiconductor chip and said second electronic part is a liquid crystal display panel.

5. An electrically connecting structure according to claim 2, wherein at least one of said first conductive particles and said second conductive particles is a resin particle covered with a conductive layer and said insulating layer covering said first conductive particles is made of thermoplastic resin.

6. An electrically connecting structure according to claim 5, wherein said first electronic part is a semiconductor chip and said second electronic part is a liquid crystal display panel.

7. An electrically connecting structure according to claim 1, wherein at least one of said first conductive particles and said second conductive particles is made of metal and said insulating layer covering said first conductive particles is made of thermoplastic resin.

8. An electrically connecting structure according to claim 7, wherein the number of said first conductive particles is substantially the same as that of said second conductive particles.

9. An electrically connecting structure according to claim 1, wherein at least one of said first conductive particles and said second conductive particles is a resin particle covered with a conductive layer and said insulating layer covering said first conductive particles is made of thermoplastic resin.

10. An electrically connecting structure according to claim 9, wherein the number of said first conductive particles is substantially the same as that of said second conductive particles.

11. An electrically connecting structure, comprising:

a first connecting terminal;

a second connecting terminal arranged to face said first connecting terminal;

a plurality of first conductive particles arranged between said first connecting terminal and said second connecting terminal, said first conductive particles being covered with an insulating layer, and portions of said insulating layer which are brought into contact with said first connecting terminal and said second connecting terminal being broken away under a force which as applied to said first connecting terminal and said second connecting terminal so that said first conducting particles are brought into contact with said first connecting terminal and said second connecting terminal;

a plurality of second conductive particles arranged between said first connecting terminal and said second connecting terminal, said second conductive particles not being covered with any material and being brought into contact with said first connecting terminal and said second connecting terminal; and an insulating adhesive filled in a gap between said first connecting terminal and said second connecting terminal, said first conductive particles and said second conductive particles having substantially the same size, and said first connecting terminal and said second connecting terminal being electrically connected to each other through said first conductive particles and said second conductive particles.

12. An electrically connecting structure according to claim 11, wherein other portions of said insulating layer covering said first conductive particles, which portions are not broken away under the force which is applied to said first connecting terminal and said second connecting terminal, still remain on said first conductive particles.

13. An electrically connecting structure according to claim 12, wherein at least one of said first conductive particles and said second conductive particles is made of metal and said insulating layer covering said first conductive particles is made of thermoplastic resin.

14. An electrically connecting structure according to claim 13, wherein said insulating adhesive is made of thermoplastic resin or thermosetting resin.

15. An electrically connecting structure according to claim 12, wherein at least one of said first conductive particles and said second conductive particles is a resin particle covered with a conductive layer and said insulating layer is covering said first conductive particles made of thermoplastic resin.

16. An electrically connecting structure according to claim 15, wherein said insulating adhesive is made of thermoplastic resin or thermosetting resin.

17. An electrically connecting structure according to claim 11, wherein at least one of said first conductive particles and said second conductive particles is made of metal and said insulating layer covering said first conductive particles is made of thermoplastic resin.

18. An electrically connecting structure according to claim 17, wherein the number of said first conductive particles is substantially the same as that of said second conductive particles.

19. An electrically connecting structure according to claim 11, wherein at least one of said first conductive particles and said second conductive particles is a resin particle covered with a conductive layer and said insulating layer covering said first conductive particles is made of thermoplastic resin.

20. An electrically connecting structure according to claim 19, wherein the number of said first conductive particles is substantially the same as that of said second conductive particles.

* * * * *